United States Patent
Li

(10) Patent No.: US 9,676,661 B2
(45) Date of Patent: Jun. 13, 2017

(54) ETCHING METHOD OF GLASS SUBSTRATE AND WET ETCHING APPARATUS THEREOF

(71) Applicant: Shenzhen China Star Optoelectronics Technology Co., Ltd., Shenzhen, Guangdong (CN)

(72) Inventor: Jia Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 364 days.

(21) Appl. No.: 14/381,984

(22) PCT Filed: Jul. 14, 2014

(86) PCT No.: PCT/CN2014/082131
§ 371 (c)(1),
(2) Date: Aug. 28, 2014

(87) PCT Pub. No.: WO2015/196520
PCT Pub. Date: Dec. 30, 2015

(65) Prior Publication Data
US 2016/0236973 A1    Aug. 18, 2016

(30) Foreign Application Priority Data

Jun. 26, 2014 (CN) .......................... 2014 1 0298834

(51) Int. Cl.
C03C 15/00 (2006.01)

(52) U.S. Cl.
CPC ................... *C03C 15/00* (2013.01)

(58) Field of Classification Search
None
See application file for complete search history.

(56) References Cited

U.S. PATENT DOCUMENTS 6,136,724 A * 10/2000 Hansen ................ B08B 3/04
438/745
6,138,694 A * 10/2000 Hansen ............ H01L 21/67178
134/58 R (Continued)

FOREIGN PATENT DOCUMENTS

CN    101399172 A    4/2009
JP    2005012093 A    1/2005

*Primary Examiner* — Shamim Ahmed
(74) *Attorney, Agent, or Firm* — Andrew C. Cheng

(57) ABSTRACT

The present invention provides an etching method of a glass substrate and a wet etching apparatus thereof. The etching method of the glass substrate comprises steps of: providing a glass substrate (1) to be etched, a wet bench (3), etchants and a supply line (7); setting a tank (9) in the wet bench (3); filling in the tank (9) with a predetermined amount of the etchants through the supply line (7); delivering the glass substrate (1) to be etched into the wet bench (3); raising the tank (9) until the glass substrate (1) is completely immersed with the etchants in the tank (9); lowering the tank (9) to expose the glass substrate (1) after a predetermined soaking time. The etching method of the glass substrate is simple and easy for operation. It is capable of shortening the etching process time and raising the production efficiency.

7 Claims, 4 Drawing Sheets

(56) References Cited

U.S. PATENT DOCUMENTS

| | | | | |
|---|---|---|---|---|
| 2001/0000575 A1* | 5/2001 | Meuris | ............ | H01L 21/67057 134/2 |
| 2002/0162579 A1* | 11/2002 | Wang | ............... | H01L 21/67086 134/26 |
| 2012/0273463 A1* | 11/2012 | Yoshikawa | ............ | C03C 15/00 216/92 |
| 2015/0144159 A1* | 5/2015 | Yu | .................... | H01L 21/67051 134/25.1 |

* cited by examiner

ETCHING METHOD OF GLASS SUBSTRATE AND WET ETCHING APPARATUS THEREOF

FIELD OF THE INVENTION

The present invention relates to a skill field of a liquid crystal display, and more particularly to an etching method of a glass substrate and a wet etching apparatus thereof.

BACKGROUND OF THE INVENTION

LCD (Liquid Crystal Display) possesses advantages of being ultra thin, power saved and radiation free. It has been widely utilized in, such as mobile phones, PDAs (personal digital assistance), digital cameras, laptop screens or notebook screens.

A thin film transistor liquid crystal display generally comprises a shell, a LCD panel located in the shell and a backlight module located in the shell. Particularly, the structure of the LCD panel can comprise a TFT Array Substrate (Thin Film Transistor Array Substrate), a CF (Color Filter) and a Liquid Crystal Layer. The working principle is that the light of backlight module is reflected to generate images by applying driving voltages to the two glass substrate for controlling the rotations of the liquid crystal molecules.

The aforesaid manufacture process of a TFT-LCD generally comprises: an Array process of the front end, which mainly a TFT substrate and a CF substrate are manufacture; a cell process in the middle, which mainly the TFT substrate and the CF substrate are laminated and liquid crystal is filled therebetween for forming a LCD panel; and a module assembly process of back end, which mainly the LCD panel, the backlight module, a PCB and other components are assembled.

The array process of the front end further comprises: processes of cleaning and drying, film coating, photoresist coating, exposing, developing, etching, stripping and etc. for the glass substrate. The etching process can be categorized as dry etching and wet etching. The wet etching utilizes liquid chemical reagents, i.e. etchants to remove the thin film uncovered with the photoresist and to form a desired pattern on the glass substrate.

In prior arts, two methods of spraying and soaking for proceeding wet etching to the glass substrate of the TFT-LCD are disclosed. Soaking means to completely immerse the glass substrate in the etchants for proceeding etching. Please refer to FIG. 1 and FIG. 2, which shows a wet etching method of a glass substrate of a TFT-LCD according to prior art. The method mainly comprises: step 1', a conveyor 100 transports a glass substrate 200 to be etched into a wet bench 300. Several baffles 400 rise up to construct a capacity space; step 2', The etchants is not stopped to be injected into the capacity space constructed by rising up the several baffles 400 via supply line 500 until glass substrate 200 to be etched is fully immersed in the etchants to be etched. The aforesaid method requires transporting the glass substrate 200 in the wet bench 300, first. Then, the etchants can be injected for proceeding the wet etching. The etching process takes more time and makes against to production efficiency.

SUMMARY OF THE INVENTION

An objective of the present invention is to provide an etching method of a glass substrate capable of shortening the etching process time and raising the production efficiency.

Another objective of the present invention is to provide a wet etching apparatus capable of allowing etchants to immerse the glass substrate to be etched in an extremely short time which is beneficial to raise the production efficiency. The structure is simple and easy for achievement.

For realizing the aforesaid objective, the present invention provides an etching method of a glass substrate, comprising steps of:

step 1, providing a glass substrate to be etched, a wet bench, etchants and a supply line;

step 2, setting a tank in the wet bench;

step 3, filling in the tank with a predetermined amount of the etchants through the supply line;

step 4, delivering the glass substrate to be etched into the wet bench;

step 5, raising the tank until the glass substrate is completely immersed with the etchants in the tank;

step 6, lowering the tank to expose the glass substrate after reaching a predetermined soaking time.

A material of the tank is PVC.

The supply line is positioned at one side of the tank for filling the etchants.

Cylinders are located at two ends of a bottom of the tank to provide power for raising and lowering the tank in the fifth step and sixth step.

The glass substrate to be etched is delivered into the wet bench by a conveyor in the fourth step, and the conveyor comprises a plurality of rollers in the wet bench, and the tank surrounds the plurality of rollers, and the rollers are positioned inside the tank after raising the tank in the fifth step.

The glass substrate to be etched is delivered to a predetermined location in the wet bench in the fourth step when the predetermined amount of the etchants is filled in the tank in the third step.

The glass substrate is a glass substrate employed in a TFT-LCD.

The present invention further provides a wet etching apparatus, comprising: a wet bench, a conveyor, a tank and a supply line, and the tank is in the wet bench, and the conveyor comprises a plurality of rollers in the wet bench, and the tank surrounds the plurality of rollers, and the supply line is employed for supplying etchants to the tank.

The wet etching apparatus further comprises a substrate, a gate on the substrate, a gate isolated layer on the substrate and the gate, and a protective layer on the source and the drain; the oxide semiconducting layer is located on the gate isolated layer.

A material of the tank is PVC.

The wet etching apparatus further comprises cylinders located at two ends of a bottom of the tank to provide power for raising and lowering the tank.

The present invention further provides a wet etching apparatus, comprising: a wet bench, a conveyor, a tank and a supply line, and the tank is in the wet bench, and the conveyor comprises a plurality of rollers in the wet bench, and the tank surrounds the plurality of rollers, and the supply line is employed for supplying etchants to the tank;

wherein a material of the tank is PVC;

wherein the wet etching apparatus further comprises cylinders, located at two ends of a bottom of the tank to provide power for raising and lowering the tank.

The benefits of the present invention are: in the etching method of the glass substrate according to the present invention, a tank is set in the wet bench. A predetermined amount of the etchants is filled in the tank before the glass substrate is delivered into the wet bench. The tank is raised by the cylinders right after the glass substrate is delivered into the wet bench and the glass substrate is completely immersed with the etchants in an extremely short time. It is capable of shortening the etching process time and raising the production efficiency; in the wet etching apparatus of the present invention, with the tank set in the wet bench and cylinders located at two ends of a bottom of the tank, quickly raising and lowering the tank can be realized by the cylinders. It allows the etchants to immerse the glass substrate in an extremely short time which is beneficial to raise the production efficiency. The structure is simple and easy for achievement.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Figure 1:
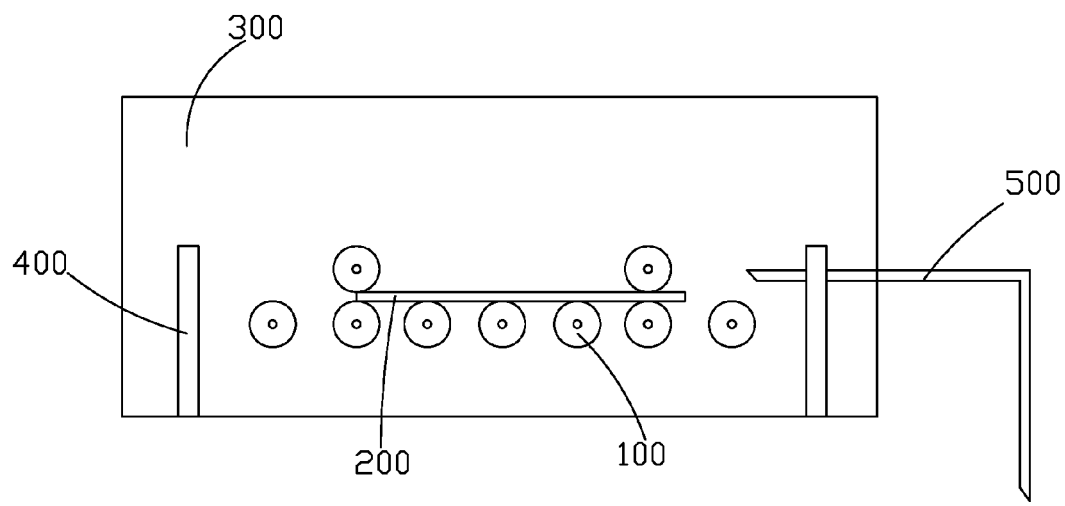
FIG. 1 is a diagram of step 1' of a wet etching method of a glass substrate according to prior art.
Figure 2:
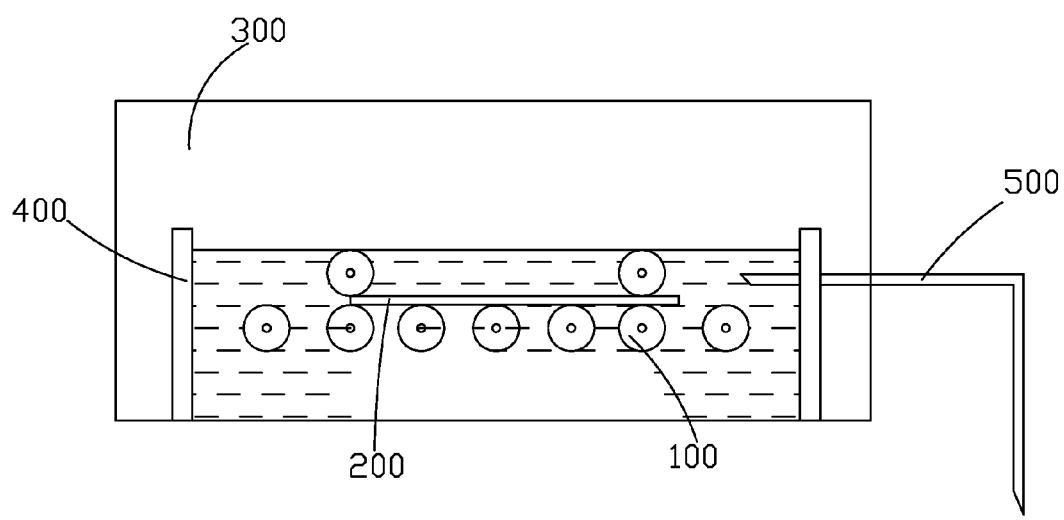
FIG. 2 is a diagram of step 2' of the wet etching method of a glass substrate according to prior art.
Figure 3:
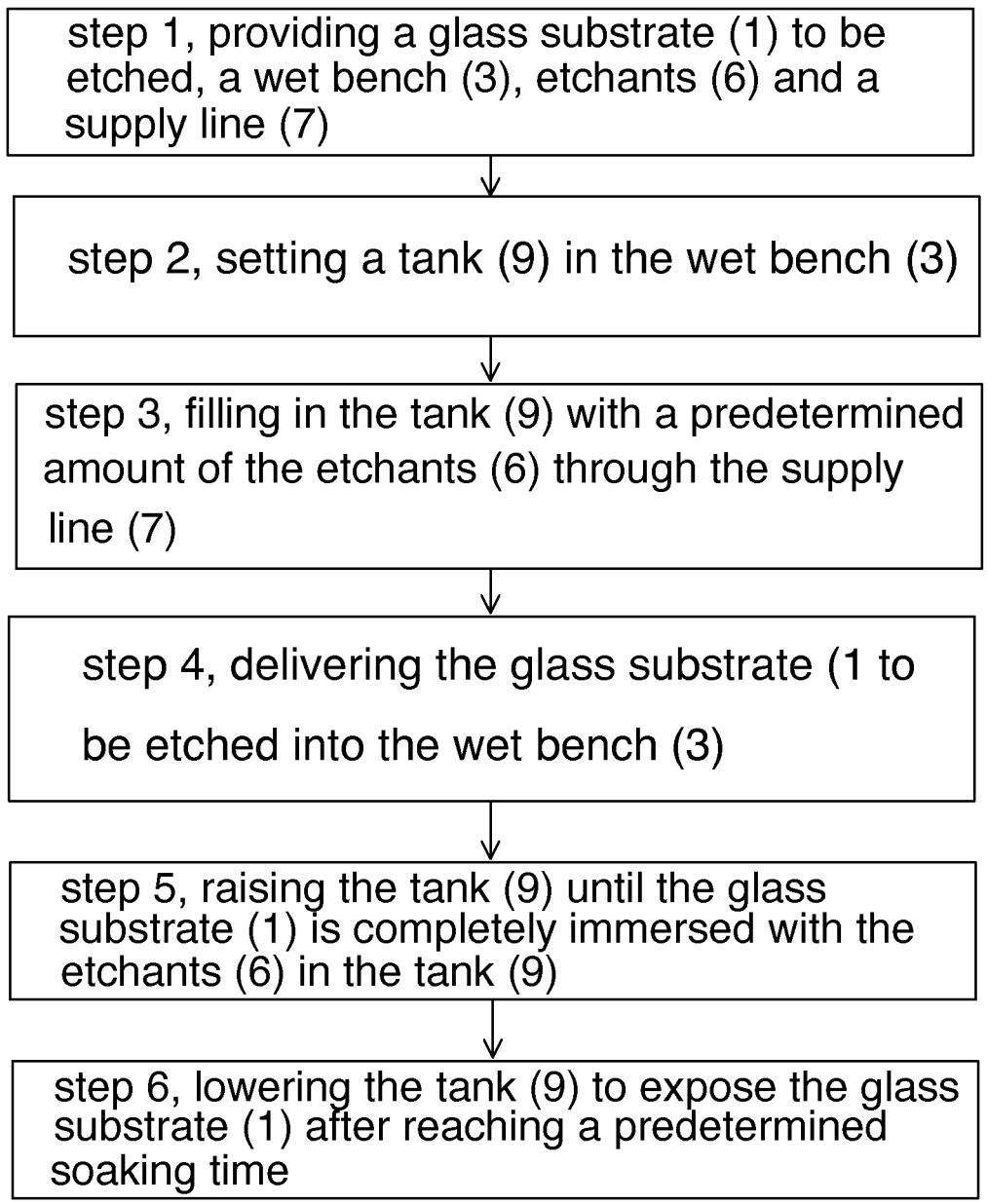
FIG. 3 is a flowchart of an etching method of a glass substrate according to the present invention.

Embodiments of the present invention are described in detail with the technical matters, structural features, achieved objects, and effects with reference to the accompanying drawings as follows.

Please refer from FIG. 3 to FIG. 6. The present invention provides an etching method of a glass substrate comprising steps of:

step 1, providing a glass substrate 1 to be etched, a wet bench 3, etchants 6 and a supply line 7;

step 2, setting a tank 9 in the wet bench 3;

step 3, filling in the tank 9 with a predetermined amount of the etchants 6 through the supply line 7;

step 4, delivering the glass substrate 1 to be etched into the wet bench 3;

step 5, raising the tank 9 until the glass substrate 1 is completely immersed with the etchants 6 in the tank 9;

step 6, lowering the tank 9 to expose the glass substrate 1 after reaching a predetermined soaking time.

Specifically, the glass substrate 1 in the step 1 is a glass substrate employed in a TFT-LCD; one end of the supply line 7 is located in the wet bench 3, and the other end is inserted in the etchants stored in the apparatus (not shown) for supplying the etchants 6 to the tank 9 in the flowing the step 3.

In the step 2, the tank 9 is set in the wet bench 3. The tank 9 is employed for filling up the etchants 6 for proceeding wet etching to the glass substrate 1 and made by corrosion preventive material. Preferably, the material of the tank 9 is PVC. Significantly, cylinders 11 are located at two ends of a bottom of the tank 9 to provide power for raising and lowering the tank 9 in the following step 5 and step 6.

In the step 3, the tank 9 is filled in with a predetermined amount of the etchants 6 through the supply line 7. The supply line 7 is positioned at one side of the tank 9 for filling the etchants 6; the predetermined amount of the etchants 6 can guarantee the glass substrate 1 to be completely immersed in the following step 5.

After the predetermined amount of the etchants 6 is filled in the tank 9 in the step 3, the step 4 is proceeded, i.e. the glass substrate 1 to be etched is delivered to a predetermined location in the wet bench 3. In the step 4, the glass substrate 1 to be etched is delivered into the wet bench 3 by a conveyor 13; the conveyor 13 comprises a plurality of rollers 131 in the wet bench 3, and the tank 9 surrounds the plurality of rollers 131; moreover, the rollers 131 are arranged in parallel at the up/down sides of the glass substrate 1. Here, the tank 9 containing the predetermined amount of the etchants 6 is below the glass substrate 1 to be etched.

In the step 5, the tank 9 is raised until the glass substrate 1 is completely immersed with the etchants 6 in the tank 9. Correspondingly, the rollers 131 are immersed in the etchants, too. This process can be done in an extremely short time, and therefore, the glass substrate 1 can be completely immersed with the etchants in an extremely short time. It is capable of shortening the etching process time and raising the production efficiency.

After reaching the predetermined soaking time, the procedure of the step 6 is proceeded. With the cylinders 11, the tank 9 is lowered to expose the glass substrate 1 for completing the etching to the glass substrate 1. The cylinders 11 quickly make the etchants 6 away from the glass substrate and faster to enter the next procedure for raising the efficiency.

Figure 4:
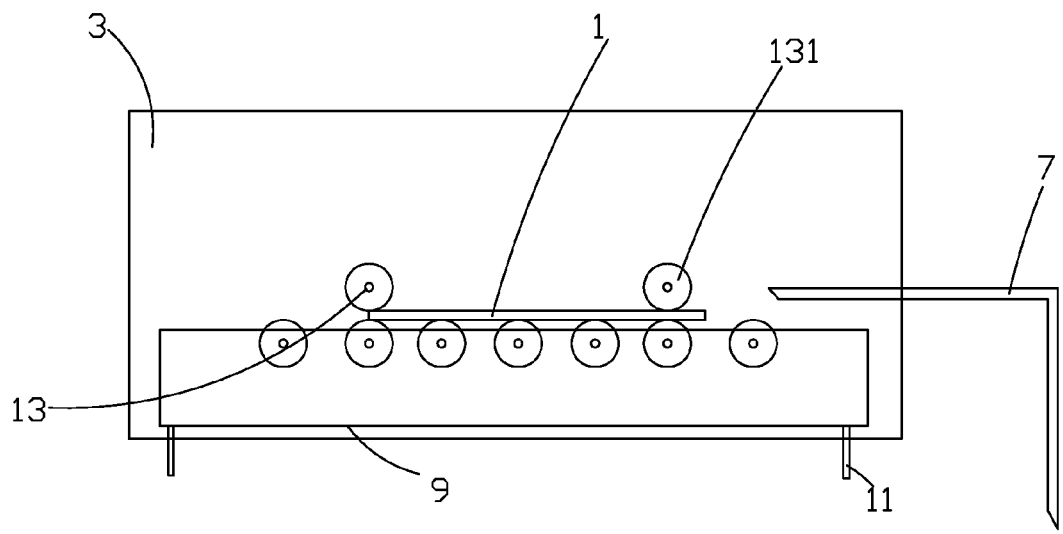
FIG. 4 is a structural diagram of a wet etching apparatus of a glass substrate according to the present invention.
Figure 5:
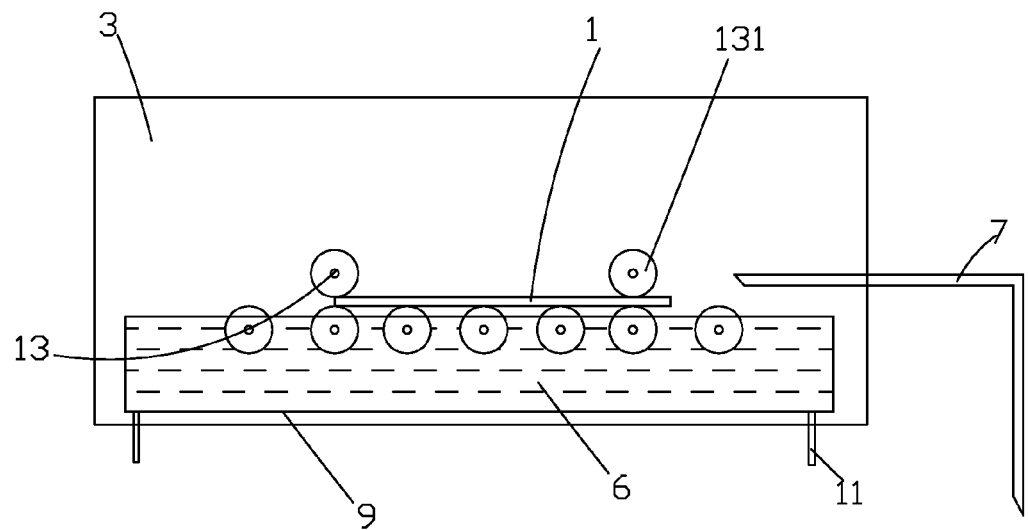
FIG. 5 is a diagram of step 4 of the etching method of a glass substrate according to the present invention.
Figure 6:
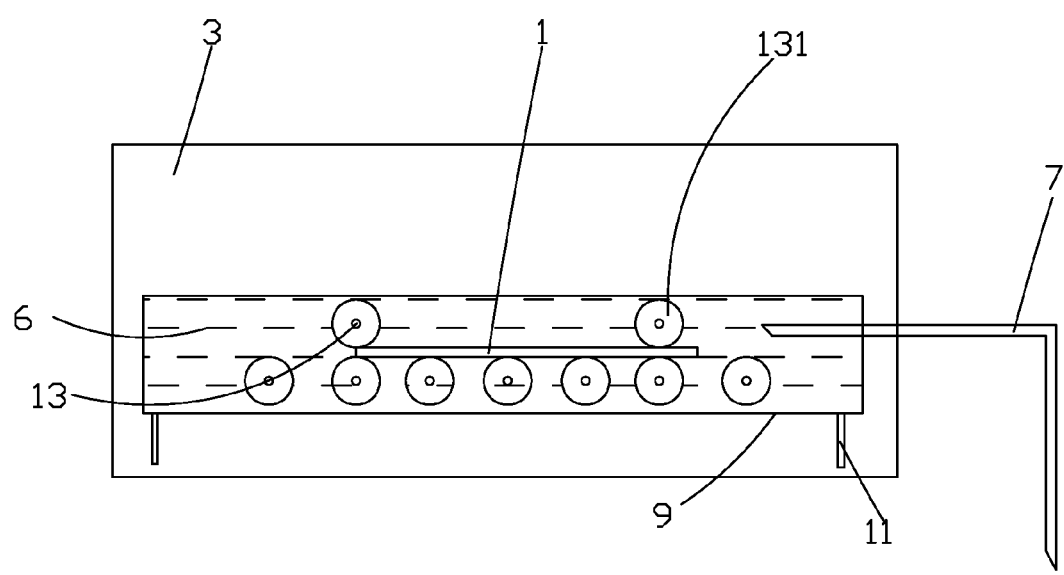
FIG. 6 is a diagram of step 5 of the etching method of a glass substrate according to the present invention.

Please refer to FIG. 4, the present invention further provides a wet etching apparatus of a glass substrate, comprising a wet bench 3, a conveyor 13, a tank 9 and a supply line 7.

The tank 9 is employed for containing the etchants 6 and set in the wet bench 3. Meanwhile, the tank 9 can be raised and lowered in the wet bench 3; the conveyor 13 is employed for delivering the glass substrate 1 to a predetermined location in the wet bench 3. The conveyor 13 comprises a plurality of rollers 131 in the wet bench 3, and the rollers 131 are arranged in parallel at the up/down sides of the glass substrate 1, and the tank 9 surrounds the plurality of rollers 131; the supply line 7 is positioned at one side of the tank 9 for aiming the tank 9 and supplying the etchants 6 to the tank 9.

A material of the tanks 9 is PVC which is corrosion preventive.

Specifically, the wet etching apparatus of the glass substrate further comprises cylinders 11, located at two ends of a bottom of the tank 9 to provide power for raising and lowering the tank 9. Before the glass substrate 1 is delivered into the wet bench 3, the tank 9 is at low level in the wet bench 3, and the tank 9 is filled in with a predetermined amount of the etchants 6 through the supply line 7; after the conveyor 13 delivers the glass substrate 1 to a predetermined location in the wet bench 3, the cylinders 11 drive and raise up the tank 9 quickly. It allows the etchants 6 in the tank 9 to immerse the glass substrate 1 in an extremely short time;

after reaching the predetermined soaking time, the cylinders 11 drive the tank 9 again to lower down the tank 9 to the original location.

In conclusion, in the etching method of the glass substrate according to the present invention, a tank is set in the wet bench. A predetermined amount of the etchants is filled in the tank before the glass substrate is delivered into the wet bench. The tank is raised by the cylinders right after the glass substrate is delivered into the wet bench and the glass substrate is completely immersed with the etchants in an extremely short time. It is capable of shortening the etching process time and raising the production efficiency; in the wet etching apparatus of the present invention, with the tank set in the wet bench and cylinders located at two ends of a bottom of the tank, quickly raising and lowering the tank can be realized by the cylinders. It allows the etchants to immerse the glass substrate in an extremely short time which is beneficial to raise the production efficiency. The structure is simple and easy for achievement.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An etching method of a glass substrate, comprising steps of:
   step 1, providing a glass substrate to be etched, a wet bench, etchants and a supply line;
   step 2, setting a tank in the wet bench;
   step 3, filling in the tank with a predetermined amount of the etchants through the supply line;
   step 4, delivering the glass substrate to be etched into the wet bench;
   step 5, raising the tank until the glass substrate is completely immersed with the etchants in the tank;
   step 6, lowering the tank to expose the glass substrate after reaching a predetermined soaking time.

2. The etching method of the glass substrate according to claim 1, wherein a material of the tank is PVC.

3. The etching method of the glass substrate according to claim 1, wherein the supply line is positioned at one side of the tank for filling the etchants.

4. The etching method of the glass substrate according to claim 1, wherein cylinders are located at two ends of a bottom of the tank to provide power for raising and lowering the tank in the fifth step and sixth step.

5. The etching method of the glass substrate according to claim 1, wherein the glass substrate to be etched is delivered into the wet bench by a conveyor in the fourth step, and the conveyor comprises a plurality of rollers in the wet bench, and the tank surrounds the plurality of rollers, and the rollers are positioned inside the tank after raising the tank in the fifth step.

6. The etching method of the glass substrate according to claim 1, wherein the glass substrate to be etched is delivered to a predetermined location in the wet bench in the fourth step when the predetermined amount of the etchants is filled in the tank in the third step.

7. The etching method of the glass substrate according to claim 1, wherein the glass substrate is a glass substrate employed in a TFT-LCD.

* * * * *